United States Patent
Kim et al.

(10) Patent No.: US 10,540,030 B2
(45) Date of Patent: Jan. 21, 2020

(54) DISPLAY DEVICE WITH TOUCH SENSING UNIT

(71) Applicant: Samsung Display Co., Ltd., Yongin-Si, Gyeonggi-Do (KR)

(72) Inventors: Junghyun Kim, Seoul (KR); Won-ki Hong, Suwon-si (KR); Minsoo Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/713,953

(22) Filed: Sep. 25, 2017

(65) Prior Publication Data
US 2018/0095574 A1 Apr. 5, 2018

(30) Foreign Application Priority Data
Sep. 30, 2016 (KR) .................. 10-2016-0127049

(51) Int. Cl.
*G06F 3/041* (2006.01)
*H01L 41/113* (2006.01)
*H01L 27/20* (2006.01)

(52) U.S. Cl.
CPC .......... *G06F 3/0412* (2013.01); *G06F 3/0414* (2013.01); *G06F 3/0416* (2013.01); *H01L 41/1132* (2013.01); *H01L 27/20* (2013.01)

(58) Field of Classification Search
CPC .... G06F 3/0412; G06F 3/0414; G06F 3/0416; G06F 1/1652; G06F 1/1616; G06F 2203/04102; H01L 27/20; H01L 41/1132
See application file for complete search history.

(56) References Cited

U.S. PATENT DOCUMENTS

| | | | | |
|---|---|---|---|---|
| 6,373,461 | B1 * | 4/2002 | Hasegawa | B06B 1/0688 257/E27.006 |
| 7,605,523 | B2 * | 10/2009 | Katsuki | G06F 3/0436 310/363 |
| 7,936,121 | B2 | 5/2011 | Kim | |
| 8,537,123 | B2 * | 9/2013 | Ho | G06F 3/0416 345/173 |
| 8,711,128 | B2 * | 4/2014 | Small | G06F 3/0412 345/177 |
| 8,941,596 | B2 * | 1/2015 | Xie | G06F 3/0414 345/173 |
| 9,046,975 | B2 * | 6/2015 | Kang | G06F 3/044 |
| 9,207,818 | B2 * | 12/2015 | Kang | G06F 3/044 |
| 9,262,003 | B2 * | 2/2016 | Kitchens | G06F 3/0414 |
| 9,274,660 | B2 * | 3/2016 | Bernstein | G06F 3/016 |
| 9,291,843 | B2 * | 3/2016 | Yeo | G02F 1/133305 |
| 9,348,504 | B2 * | 5/2016 | Kwak | G06F 1/1616 |

(Continued)

FOREIGN PATENT DOCUMENTS

KR    1020160082902 A    7/2016

*Primary Examiner* — Michael J Jansen, II
(74) *Attorney, Agent, or Firm* — Cantor Colburn LLP

(57) ABSTRACT

A display device may include a first substrate, a touch sensor disposed on the first substrate, a second substrate disposed on the touch sensor, and a display unit disposed on the second substrate and which displays an image. The touch sensor includes a piezoelectric device, which senses a touch thereon, and an adhesive layer, which attaches the first and second substrates to each other. The piezoelectric device and the adhesive layer are disposed in a same layer.

19 Claims, 17 Drawing Sheets

(56) References Cited

U.S. PATENT DOCUMENTS

| | | | |
|---|---|---|---|
| 9,372,509 B2* | 6/2016 | Chang | G06F 3/044 |
| 9,377,817 B2* | 6/2016 | Eguchi | G06F 1/1652 |
| 9,459,656 B2* | 10/2016 | Shai | G06F 1/1615 |
| 9,478,728 B2* | 10/2016 | Capobianco | F04B 43/046 |
| 9,519,366 B2* | 12/2016 | Park | G06F 3/041 |
| 9,571,734 B2* | 2/2017 | Kwak | G06T 3/40 |
| 9,582,043 B2* | 2/2017 | Hirakata | G02F 1/133305 |
| 9,582,705 B2* | 2/2017 | Du | G06K 9/00033 |
| 9,588,549 B2* | 3/2017 | Endo | G06F 1/1652 |
| 9,600,104 B2* | 3/2017 | Bayramoglu | G06F 3/041 |
| 9,665,200 B2* | 5/2017 | Filiz | G01L 1/18 |
| 9,665,763 B2* | 5/2017 | Du | G06K 9/0002 |
| 9,696,899 B2* | 7/2017 | Kim | G06F 3/0486 |
| 9,710,033 B2* | 7/2017 | Yamazaki | G06F 1/263 |
| 9,733,751 B2* | 8/2017 | Lo | G06F 3/0416 |
| 9,798,434 B2* | 10/2017 | Lee | G06F 3/044 |
| 9,818,928 B2* | 11/2017 | Park | H01L 41/0825 |
| 9,836,171 B2* | 12/2017 | Watazu | G06F 3/0414 |
| 9,864,450 B2* | 1/2018 | Watazu | H01L 41/0478 |
| 9,911,184 B2* | 3/2018 | Du | G06K 9/00067 |
| 9,939,101 B2* | 4/2018 | Yun | G06F 1/1652 |
| 9,952,626 B2* | 4/2018 | Jinbo | G06F 1/1652 |
| 9,958,976 B2* | 5/2018 | Endo | G06F 1/1652 |
| 10,013,058 B2* | 7/2018 | Puskarich | G06F 3/016 |
| 10,303,279 B2* | 5/2019 | Wang | G06F 3/0412 |
| 10,331,247 B2* | 6/2019 | Jinbo | G06F 3/0412 |
| 2006/0262099 A1* | 11/2006 | Destura | G02F 1/13338 345/173 |
| 2006/0262100 A1* | 11/2006 | Van Berkel | G06F 3/0412 345/173 |
| 2008/0278070 A1* | 11/2008 | Kim | G06F 3/0412 313/504 |
| 2010/0013797 A1* | 1/2010 | Kim | G06F 3/0436 345/176 |
| 2010/0039396 A1* | 2/2010 | Ho | G06F 3/0416 345/173 |
| 2010/0066686 A1* | 3/2010 | Joguet | G06F 3/0412 345/173 |
| 2010/0295807 A1* | 11/2010 | Xie | G06F 3/045 345/173 |
| 2011/0102314 A1* | 5/2011 | Roux | G06F 15/02 345/156 |
| 2011/0210937 A1* | 9/2011 | Kee | G06F 3/041 345/174 |
| 2011/0227822 A1* | 9/2011 | Shai | G06F 1/1615 345/156 |
| 2012/0068957 A1* | 3/2012 | Puskarich | G06F 3/016 345/174 |
| 2012/0111119 A1* | 5/2012 | Small | G06F 3/0436 73/633 |
| 2012/0162099 A1* | 6/2012 | Yoo | G06F 3/0412 345/173 |
| 2013/0300678 A1* | 11/2013 | Kang | G06F 3/044 345/173 |
| 2013/0335371 A1* | 12/2013 | Bayramoglu | G06F 3/041 345/174 |
| 2014/0054438 A1* | 2/2014 | Yun | G06F 1/1652 248/550 |
| 2014/0055394 A1* | 2/2014 | Park | H01L 41/0825 345/173 |
| 2014/0098188 A1* | 4/2014 | Kwak | G06T 3/40 348/38 |
| 2014/0101575 A1* | 4/2014 | Kwak | G06F 1/1616 715/761 |
| 2014/0101579 A1* | 4/2014 | Kim | G06F 3/0486 715/761 |
| 2014/0132553 A1* | 5/2014 | Park | G06F 3/044 345/174 |
| 2014/0139447 A1* | 5/2014 | Kang | G06F 3/044 345/173 |
| 2014/0333855 A1* | 11/2014 | Park | G06F 3/041 349/12 |
| 2014/0361980 A1* | 12/2014 | Iwaki | G06F 3/14 345/156 |
| 2015/0055286 A1* | 2/2015 | Eguchi | G06F 1/1652 361/679.26 |
| 2015/0062525 A1* | 3/2015 | Hirakata | G02F 1/133305 349/158 |
| 2015/0109544 A1* | 4/2015 | Yeo | G02F 1/133305 349/12 |
| 2015/0123931 A1* | 5/2015 | Kitchens | G06F 3/0414 345/174 |
| 2015/0185574 A1* | 7/2015 | Han | G02F 1/136286 349/43 |
| 2015/0242022 A1* | 8/2015 | Hung | G06F 1/1615 345/174 |
| 2015/0248149 A1* | 9/2015 | Yamazaki | G06F 1/263 361/679.27 |
| 2015/0261259 A1* | 9/2015 | Endo | G06F 1/1652 361/679.06 |
| 2015/0324046 A1* | 11/2015 | Lo | G06F 3/0416 345/173 |
| 2015/0338888 A1* | 11/2015 | Kim | G06F 1/1677 345/156 |
| 2015/0378557 A1* | 12/2015 | Jeong | G06F 3/0488 715/835 |
| 2016/0103539 A1* | 4/2016 | Jinbo | G06F 3/0412 345/173 |
| 2016/0124560 A1* | 5/2016 | Watazu | H01L 41/0478 345/173 |
| 2016/0132151 A1* | 5/2016 | Watazu | G06F 3/0414 345/174 |
| 2016/0139717 A1* | 5/2016 | Filiz | G01L 1/18 345/173 |
| 2016/0187930 A1* | 6/2016 | Jinbo | G06F 1/1652 313/511 |
| 2016/0188098 A1* | 6/2016 | Her | G06F 3/0416 345/173 |
| 2016/0209959 A1* | 7/2016 | Lee | G06F 3/044 |
| 2016/0218272 A1* | 7/2016 | Capobianco | F04B 43/046 |
| 2016/0364048 A1* | 12/2016 | Park | G06F 3/044 |
| 2016/0364063 A1* | 12/2016 | Wang | G06F 1/3262 |
| 2017/0031389 A1* | 2/2017 | Yoo | G06F 1/1652 |
| 2017/0068370 A1* | 3/2017 | Hong | G06F 1/1616 |
| 2017/0090028 A1* | 3/2017 | Djordjev | G01S 15/89 |
| 2017/0097660 A1* | 4/2017 | Alonso | G06F 1/1641 |
| 2017/0102738 A1* | 4/2017 | Park | G06F 1/1652 |
| 2017/0123558 A1* | 5/2017 | Hong | G09G 3/001 |
| 2017/0131809 A1* | 5/2017 | Lin | G06F 3/044 |
| 2017/0177130 A1* | 6/2017 | Endo | G06F 1/1652 |
| 2017/0242526 A1* | 8/2017 | Cheng | G06F 3/0414 |
| 2017/0285810 A1* | 10/2017 | Krah | G06F 3/0412 |
| 2017/0344120 A1* | 11/2017 | Zuniga | G06F 1/1649 |
| 2018/0011575 A1* | 1/2018 | Yoon | G06F 3/044 |
| 2018/0035208 A1* | 2/2018 | Choi | G06F 3/167 |
| 2018/0046302 A1* | 2/2018 | Wang | G06F 3/0412 |
| 2018/0095502 A1* | 4/2018 | Yamazaki | F16M 11/38 |
| 2018/0095574 A1* | 4/2018 | Kim | H01L 27/20 |
| 2018/0107324 A1* | 4/2018 | Ding | G01L 1/16 |
| 2018/0173356 A1* | 6/2018 | Huang | G06F 3/0414 |
| 2018/0267574 A1* | 9/2018 | Cho | G06F 1/1652 |
| 2018/0267655 A1* | 9/2018 | Xu | G06F 3/0414 |
| 2018/0328799 A1* | 11/2018 | Park | G06F 3/0416 |
| 2018/0329558 A1* | 11/2018 | Park | G06F 3/0416 |
| 2019/0004651 A1* | 1/2019 | Hong | G06F 3/0412 |
| 2019/0012029 A1* | 1/2019 | Hong | G06F 3/0412 |
| 2019/0042046 A1* | 2/2019 | Filiz | G06F 3/0414 |
| 2019/0073036 A1* | 3/2019 | Bernstein | G06F 3/016 |

* cited by examiner

DISPLAY DEVICE WITH TOUCH SENSING UNIT

This application claims priority to Korean Patent Application No. 10-2016-0127049, filed on Sep. 30, 2016, and all the benefits accruing therefrom under 35 U.S.C. § 119, the content of which in its entirety is herein incorporated by reference.

BACKGROUND

1. Field

The disclosure relates to a display device with a touch sensor.

2. Description of the Related Art

A touch panel is an input device that enables a user to interface with an information communication device with a display device through direct contact between the user's hand or pen and a screen of the display device. In general, the touch panel is used to realize a touch panel technology, which is one of various technologies for the interfacing between the information communication device and the user.

The touch panel may allow a user to operate a computer in a communicative and intuitive manner (e.g., by touching a button, which is displayed on a display screen, with a finger). Accordingly, anyone can use the touch panel as an input device for inputting data to a computer. As a result, the touch panel is widely being used in many fields such as computer monitors, mobile phones, personal digital assistants ("PDA"s), banks or public offices, various medical systems, tourist signboards, signboards of major institutions, and traffic information boards.

SUMMARY

In general, a touch panel is provided on a display panel and is used to sense a touch of a user. However, the touch panel on the display panel may lead to deterioration in transmittance and visibility of the display panel.

Some embodiments of the invention provide a touch sensor, which is configured to improve visibility and transmittance of an image displayed therethrough, and a display device including the touch sensor.

According to an embodiment of the invention, a display device includes a first substrate, a touch sensor disposed on the first substrate, a second substrate disposed on the touch sensor, and a display unit disposed on the second substrate and which displays an image. In such an embodiment, the touch sensor includes a piezoelectric device, which senses a touch thereon, and an adhesive layer, attaches the first and second substrates to each other. In such an embodiment, the piezoelectric device and the adhesive layer are disposed in a same layer.

In an embodiment of the invention, the piezoelectric device of the touch sensor may include a polysilicon.

In an embodiment of the invention, the touch sensor may further include a first signal line and a second signal line, which are connected to the piezoelectric device.

In an embodiment of the invention, the first and second signal lines may include a polysilicon and may be disposed at a same level as the piezoelectric device.

In an embodiment of the invention, the first signal line and the second signal line may include a first metal layer and a second metal layer, which are disposed on the piezoelectric device and the adhesive layer.

In an embodiment of the invention, the touch sensor may include a plurality of piezoelectric devices, which are arranged in a matrix form including a plurality of rows and a plurality of columns.

In an embodiment of the invention, the plurality of piezoelectric devices may be connected to the first signal line, and each of the plurality of piezoelectric devices may be connected to a corresponding one of a plurality of second signal lines.

In an embodiment of the invention, each of the plurality of piezoelectric devices may be connected to a corresponding one of a plurality of first signal lines and a corresponding one of a plurality of second signal lines.

In an embodiment of the invention, the plurality of first signal lines may be arranged in a first direction, and the plurality of second signal lines may be arranged and may be spaced apart from each other in a second direction crossing the first direction in a way such that the second signal lines do not overlap the first signal lines.

In an embodiment of the invention, the touch sensor may further include a bridge electrode, which electrically connects the second signal lines spaced apart from each other in the second direction to each other, and an insulating layer disposed between the first signal lines and the bridge electrode.

In an embodiment of the invention, the touch sensor may include a first extension line extending from the first signal line and disposed on the piezoelectric device, and a second extension line extending from the second signal line and disposed on the piezoelectric device. In such an embodiment, the first and second extension lines may be spaced apart from each other by a predetermined distance.

In an embodiment of the invention, the first substrate may define a lower protection film.

In an embodiment of the invention, the display unit may include an organic electric field light-emitting device and an encapsulation layer, which seals the organic electric field light-emitting device.

According to an embodiment of the invention, a display device includes a housing including a contact member, and a display module coupled to the housing and spaced apart from the contact member by a predetermined distance, where the display module includes a folding region, a first non-folding region adjacent to the folding region and a second non-folding region, where the folding region is interposed therebetween the first non-folding region and the second non-folding region. In such an embodiment, the display module may include a first substrate, a touch sensor disposed on the first substrate and in the folding region, and a second substrate disposed on the touch sensor. In such an embodiment, the touch sensor includes a piezoelectric device, which senses an external pressure, and an adhesive layer, which attaches the first and second substrates to each other, and the piezoelectric device and the adhesive layer are disposed in a same layer.

In an embodiment of the invention, the housing may further include a first supporting member, a second supporting member, and a connection member, which connects the first supporting member to the second supporting member and to enclose the contact member. In such an embodiment, the first non-folding region may be coupled to the first supporting member, the second non-folding region may be coupled to the second supporting member, and the folding region may be provided to correspond to the connection member.

In an embodiment of the invention, the piezoelectric device of the touch sensor may include a polysilicon.

In an embodiment of the invention, the first and second signal lines may include a polysilicon and may be disposed at a same level as the piezoelectric device.

In an embodiment of the invention, the folding region of the display module may be foldable around a folding axis extending in a first direction.

In an embodiment of the invention, the display module may further include a display unit, which overlaps the first non-folding region, the folding region and the second non-folding region and displays an image.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

DETAILED DESCRIPTION

Figure 1:
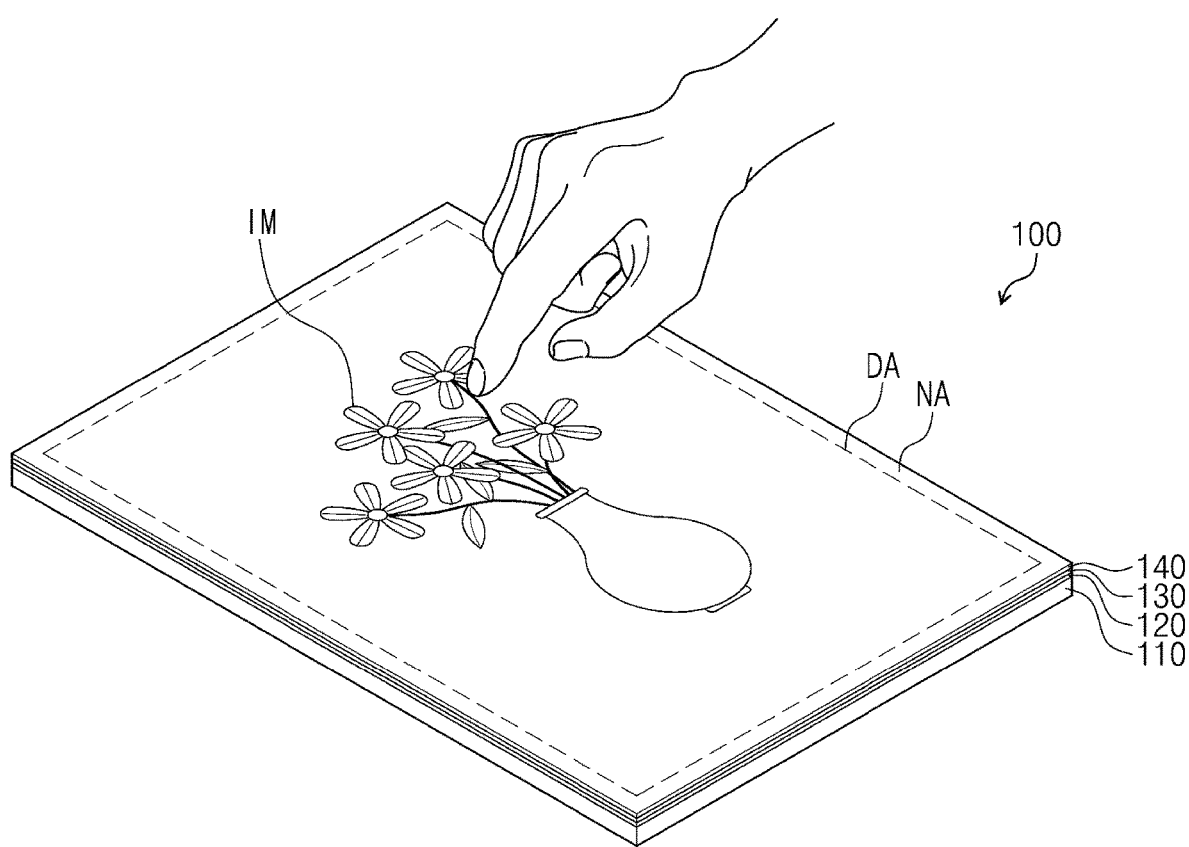
FIG. 1 is a schematic perspective view of a display device according to some embodiments of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

FIG. 1 is a schematic perspective view of a display device according to some embodiments of the invention.

Referring to FIG. 1, an embodiment of a display device 100 includes a first substrate 110, a touch sensor 120, a second substrate 130, and a display unit 140. Although not shown in FIG. 1, the display device 100 may further include a polarization plate disposed on the display unit 140.

The touch sensor 120 may be disposed on the first substrate 110. The second substrate 130 may be disposed on the touch sensor 120. The display unit 140 may be disposed on the second substrate 130 and may display an image.

In an embodiment where a touch of a user occurs on a top surface of the display unit 140, the display unit 140 may be curved or bent. In one embodiment, for example, the display unit 140 may be flexible.

The display unit 140 may be one of an organic light emitting display panel, an electrophoresis display panel, and an electrowetting display panel, for example. Hereinafter, for convenience of description, embodiments where the display unit 140 is the organic light emitting display panel will be described in detail.

The display unit 140 may include a display region DA including a plurality of pixels and a non-display region NA surrounding the display region DA. The display region DA may display an image, and no image is displayed on the non-display region NA. In such an embodiment, an image IM may be displayed on the display region DA of the display unit 140.

The second substrate 130 may be disposed between the display unit 140 and the touch sensor 120. In an embodiment, the second substrate 130 may include, for example, at least one selected from polyethyleneterephthalate ("PET"), polycarbonate ("PC"), acryl, polymethylmethacrylate ("PMMA"), triacetyl cellulose ("TAC"), polyether sulfone ("PES"), and polyimide ("PI"), but not being particularly limited thereto.

The touch sensor 120 may be disposed below the display unit 140 and may detect a change in pressure, which occurs when a user touches the top surface of the display unit 140.

In such an embodiment, as shown in FIG. 1, the display device 100 includes the touch sensor 120 disposed below the display unit 140, such that surface brightness and transmittance of the display unit 140 is effectively prevented from being deteriorated, thereby improving a power consumption property of the display device 100. In such an embodiment, visibility of an image to be displayed on the display unit 140 may be improved.

The first substrate 110 may be disposed below the touch sensor 120 and may protect the display unit 140 and the touch sensor 120. In one embodiment, for example, the first substrate 110 may prevent moisture from passing through a rear surface of the display device 100 and protect the display unit 140 and the touch sensor 120 from external impact.

Figure 2:
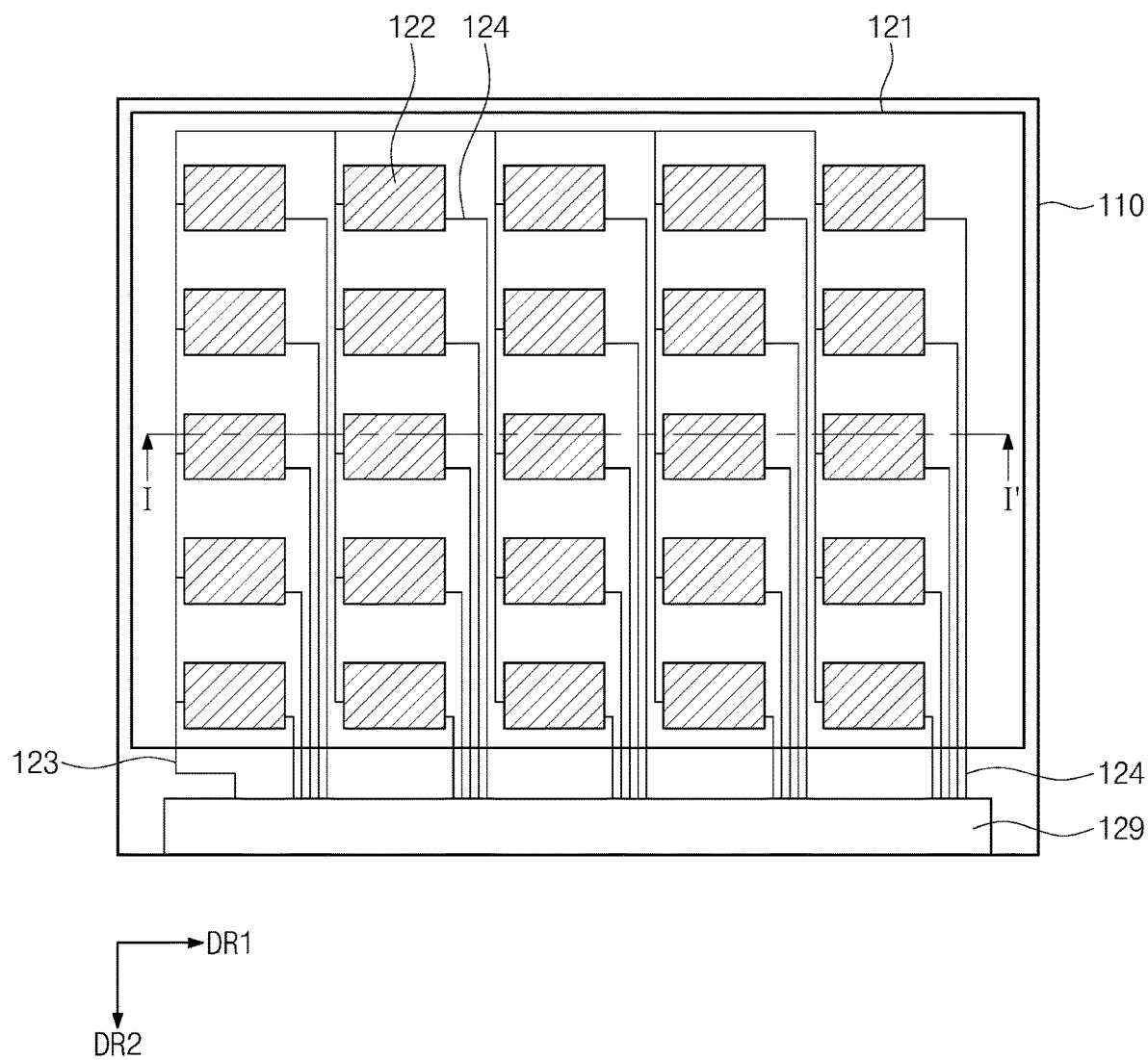
FIG. 2 is a plan view of a touch sensor on a first substrate shown in FIG. 1.
Figure 3:
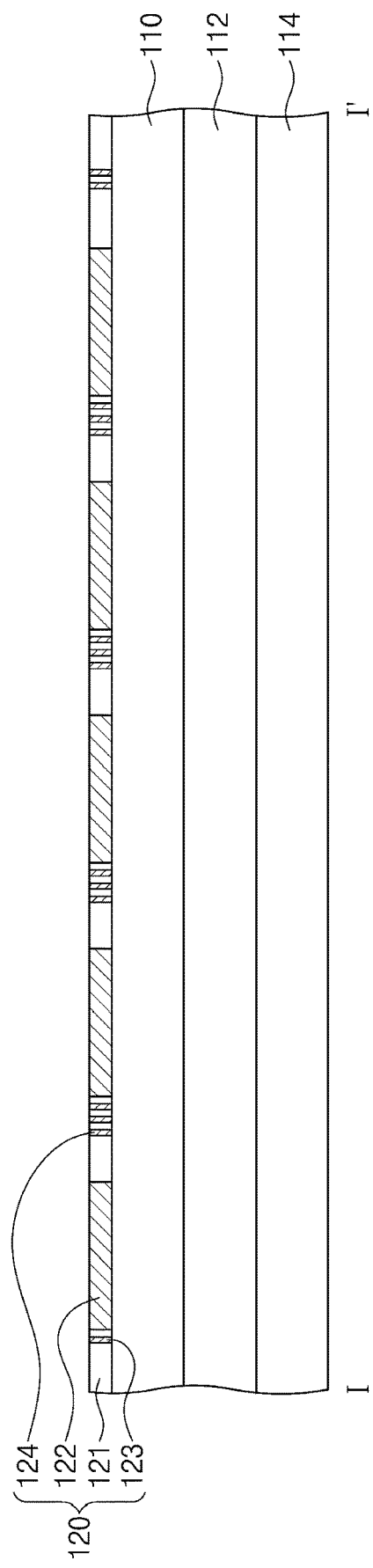
FIG. 3 is a cross-sectional view taken along line I-I' of FIG. 1.

FIG. 2 is a plan view of a touch sensor on a first substrate shown in FIG. 1. FIG. 3 is a cross-sectional view taken along line I-I' of FIG. 2.

Referring to FIGS. 2 and 3, the first substrate 110 may include or be defined by a lower protection film that protects a lower surface of the touch sensor 120 disposed thereon. The display device 100 may further include a lower adhesive layer 112 and a base film 114, which are disposed on a rear surface of the first substrate 110.

The first substrate 110 may be a thin film, which is made of at least one selected from, for example, PET, PC, acryl, PMMA, TAC, PES and PI, similar to the second substrate 130 of FIG. 1.

In an embodiment, the base film 114 may include a shape memory alloy, which may allow the base film 114 to have high shape-restoring and high heat-resisting properties. In such an embodiment, the base film 114 may have high elasticity, which may allow the base film 114 to have high bending and flatness properties. In such an embodiment, the shape memory alloy may be, for example, nitinol, but not being particularly limited thereto. The base film 114 may be flexible, and the base film 114 may protect a rear surface of the display unit 140.

The lower adhesive layer 112 may be disposed between the base film 114 and the first substrate 110, and may attach the first substrate 110 to the base film 114. The lower adhesive layer 112 may be a pressure sensitive adhesive ("PSA"), but not being particularly limited thereto. The lower adhesive layer 112 may have a highly adhesive property. In one embodiment, for example, during fabricating the display device, the lower adhesive layer 112 may prevent the base film 114 from being peeled or detached, and prevent the first substrate 110 and the base film 114 from being separated from each other in a state where the base film 114 is bent.

The touch sensor 120 may be disposed on the first substrate 110 and may include an adhesive layer 121, a piezoelectric device 122, a first signal line 123, and a second signal line 124.

The adhesive layer 121 may include or be formed of a material for enhancing an adhesion between the first and second substrates 110 and 130 of FIG. 1. In one embodiment, for example, the adhesive layer 121 may be formed of or include amorphous silicon ("a-Si").

The piezoelectric device 122, the first signal line 123 and the second signal line 124 may be disposed at a same level, or directly on a same layer, as the adhesive layer 121. In one embodiment, for example, the piezoelectric device 122, the first signal line 123 and the second signal line 124 may include or be formed of a polysilicon layer, which is obtained by crystalizing the amorphous silicon layer of the adhesive layer 121.

The crystallization method for converting the amorphous silicon layer to the polysilicon layer may be classified into thermal crystallization methods (e.g., solid phase crystallization, metal-induced crystallization, and metal-induced lateral crystallization), and laser-based crystallization methods (e.g., excimer laser crystallization and sequential lateral solidification).

In an embodiment, an a-Si layer may be formed on a lower protection film, which defines the first substrate 110, and then, the excimer laser may locally crystalize portions of the amorphous silicon layer to form the piezoelectric device 122, the first signal line 123 and the second signal line 124. A non-crystalized region of the amorphous silicon layer may be used as the adhesive layer 121 for maintaining the adhesion property between the second substrate 130 and the lower protection film. Since the piezoelectric device 122 includes polysilicon, when external pressure is applied thereto, a current may be generated in the piezoelectric device 122; that is, the piezoelectric device 122 may have a piezoelectric property.

As shown in FIG. 2, the touch sensor 120 may include a plurality of piezoelectric devices 122. The plurality of the piezoelectric devices 122 may be arranged in a first direction DR1 and a second direction DR2 or arranged in a matrix form. The first signal line 123 and the second signal lines 124 may extend from a pad portion 129, and may be electrically connected to the plurality of the piezoelectric devices 122.

The first signal line 123 may be commonly connected to the piezoelectric devices 122. The second signal lines 124 may be connected to the piezoelectric devices 122, respectively. Each of the second signal lines 124 may provide a touch signal, which is obtained by a corresponding one of the piezoelectric devices 122, to the pad portion 129.

In an embodiment, as shown in FIG. 2, the piezoelectric devices 122 may be rectangular-shaped patterns that are arranged in a matrix form, but the invention is not limited thereto. In one embodiment, for example, a shape of each of the piezoelectric devices 122 may be one of polygons (e.g., rhombus, triangle and hexagon), circle and ellipse.

Figure 4:
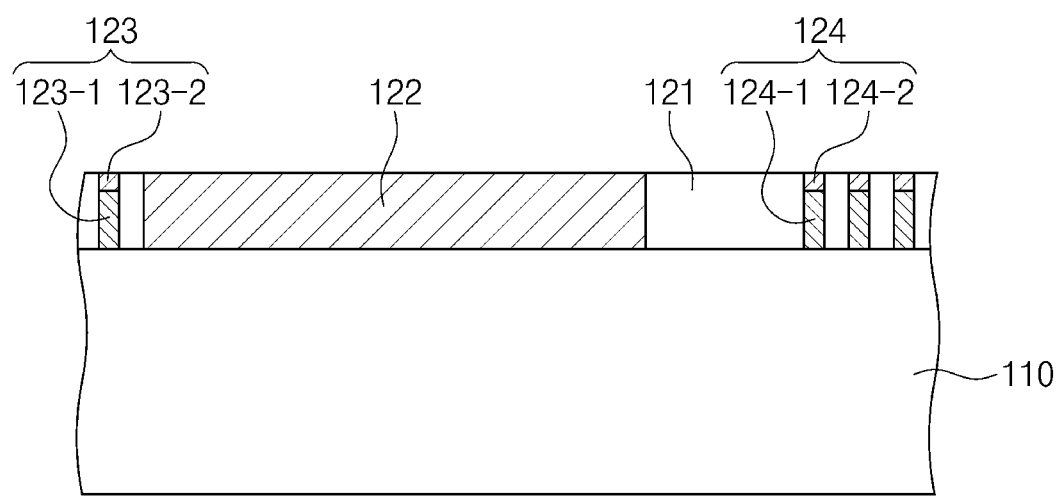
FIG. 4 is a cross-sectional view partially illustrating a first signal line and a second signal line according to some embodiments of the invention.

FIG. 4 is a cross-sectional view partially illustrating a first signal line and a second signal line according to some embodiments of the invention. FIG. 4 is an enlarged view illustrating the first and second signal lines, which are located at a region of FIG. 3, and for convenience of description, the same elements shown in FIG. 4 have been labeled with the same reference characters shown in FIG. 3, and any repetitive detailed description thereof will hereinafter be omitted or simplified.

Referring to FIG. 4, the piezoelectric device 122, the first signal line 123, and the second signal line 124 may be disposed at a same level, or directly on a same layer, as the adhesive layer 121. The first signal line 123 may include a first signal line layer 123-1 and a first metal silicide layer 123-2. The second signal line 124 may include a second signal line layer 124-1 and a second metal silicide layer 124-2. In one embodiment, for example, the piezoelectric device 122, the first signal line layer 123-1, and the second signal line layer 124-1 may include or be formed of a polysilicon layer, which is obtained by crystalizing the amorphous silicon layer of the adhesive layer 121. In an embodiment, the first metal silicide layer 123-2 and the second metal silicide layer 124-2 may be formed on the first signal line layer 123-1 and the second signal line layer 124-1, respectively, by a silicidation process. The first metal silicide layer 123-2 and the second metal silicide layer 124-2 may contribute to reduce electric resistance of the first signal line 123 and the second signal line 124.

Figure 5:
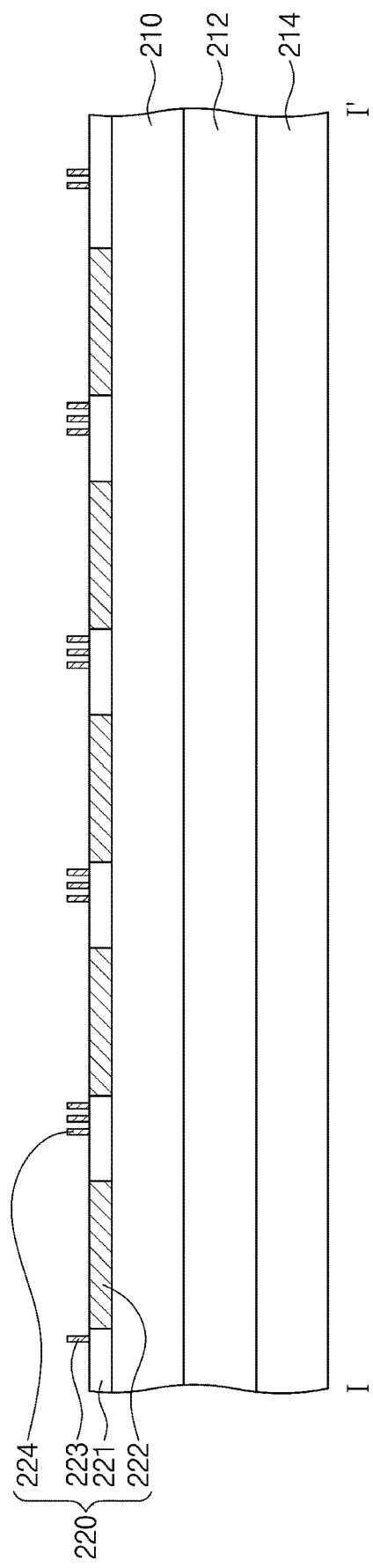
FIG. 5 is a cross-sectional view illustrating a portion of a display device according to some alternative embodiments of the invention.

FIG. 5 is a cross-sectional view illustrating a portion of a display device according to some alternative embodiments of the invention.

Referring to FIG. 5, a first substrate 210 may include or be a lower protection film. The display device may further include a lower adhesive layer 212 and a base film 214. A touch sensor 220 may include an adhesive layer 221, a piezoelectric device 222, a first signal line 223, and a second signal line 224.

The adhesive layer 221 may be formed of or include an a-Si layer.

The piezoelectric device 222 may be disposed at a same level, or directly on a same layer, as the adhesive layer 221. In one embodiment, for example, the piezoelectric device 222 may include or be formed of a polysilicon layer, which is obtained by crystalizing the amorphous silicon layer of the adhesive layer 221.

The first signal line 223 and the second signal line 224 may be disposed at a level different from that of the piezoelectric device 222, and may include or be formed of a material different from that of the piezoelectric device 222. In one embodiment, for example, the first signal line 223 and the second signal line 224 may be disposed on the adhesive layer 221. The first signal line 223 and the second signal line 224 may include or be formed of at least one selected from transparent conductive materials (e.g., indium tin oxide ("ITO")) and low resistance metallic materials (e.g., molybdenum (Mo), silver (Ag), titanium (Ti), copper (Cu) and aluminum (Al)).

Figure 6:
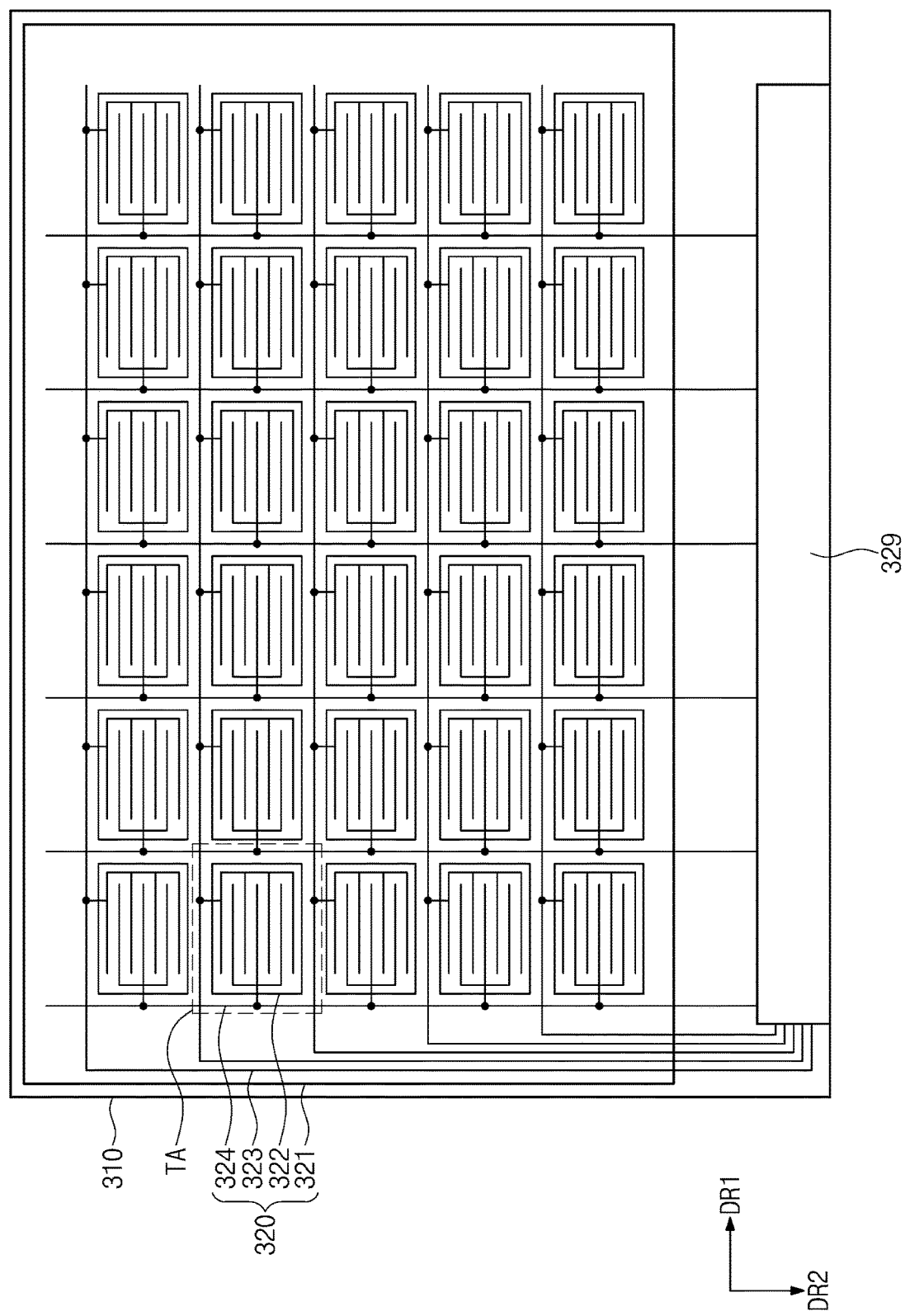
FIG. 6 is a plan view illustrating a touch sensor according to some embodiments of the invention.
Figure 7:
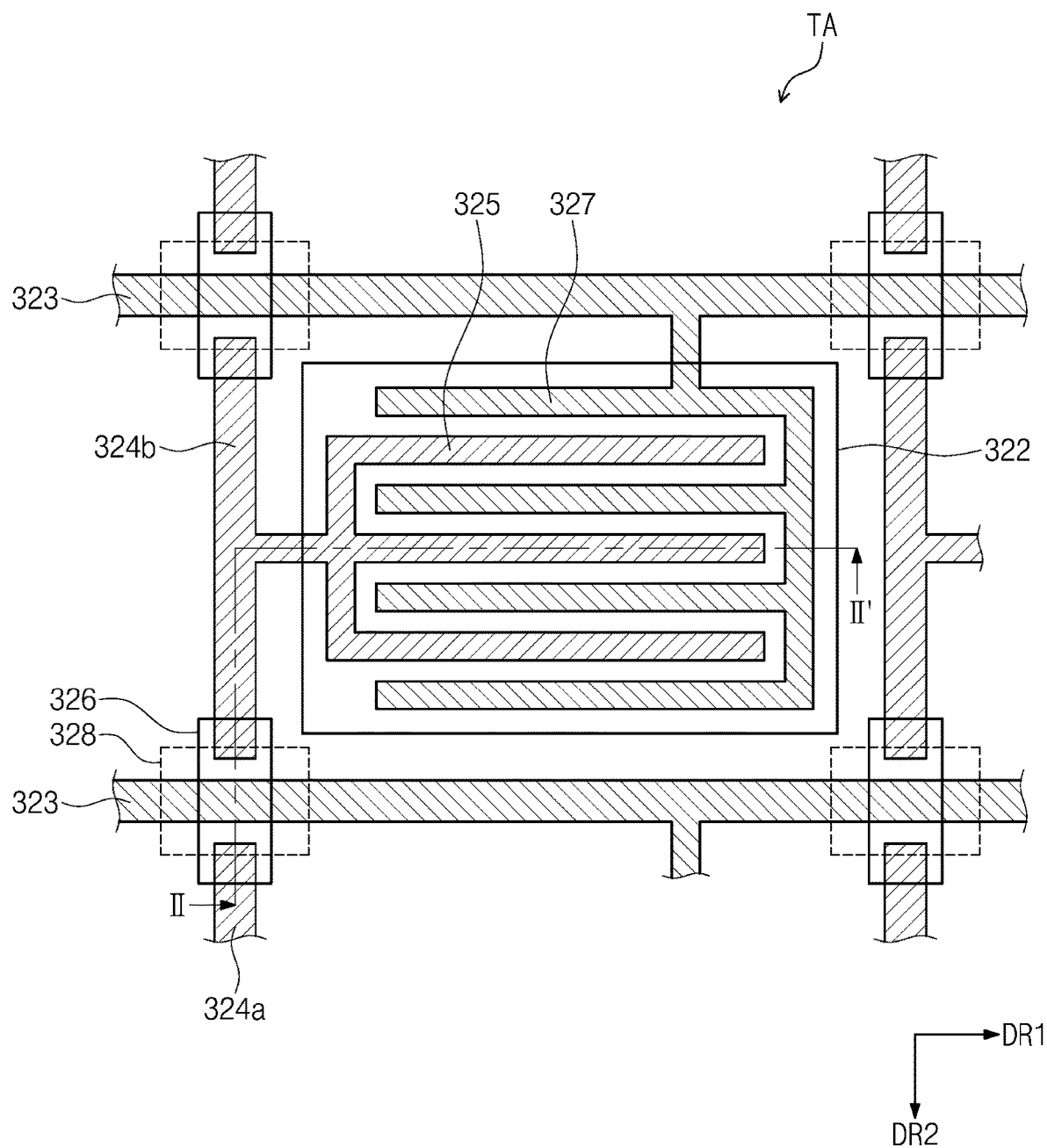
FIG. 7 is an enlarged plan view of a portion of a touch region of FIG. 6.
Figure 8:
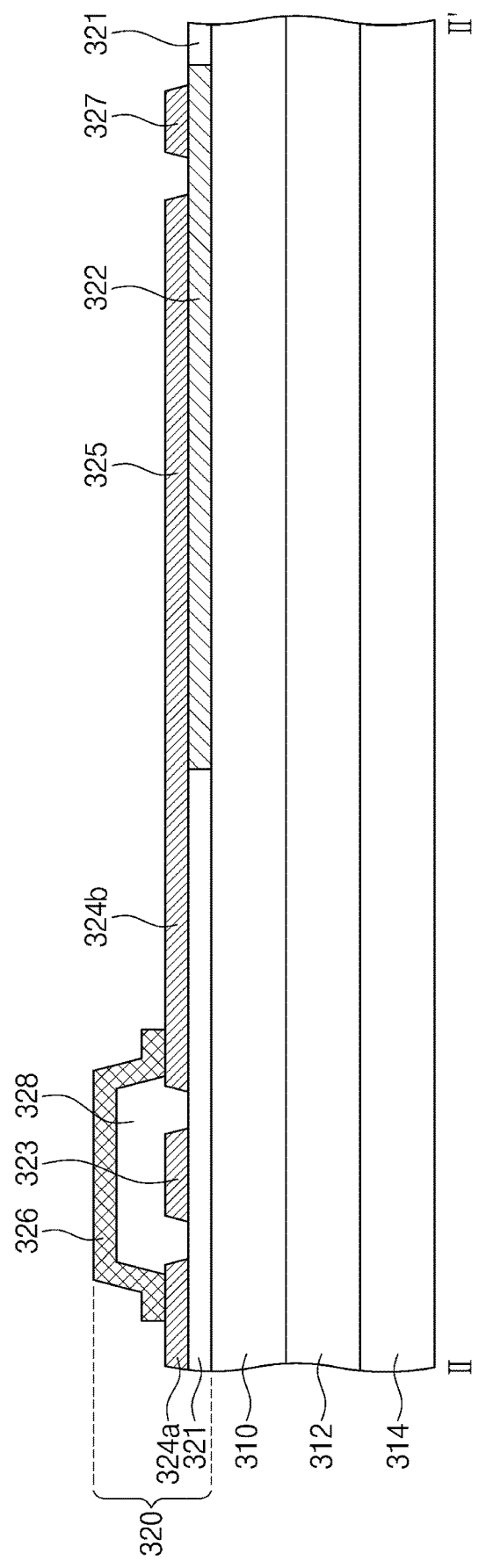
FIG. 8 is a cross-sectional view of the touch sensor of FIG. 6, taken along line II-II'.

FIG. 6 is a plan view illustrating a touch sensor according to some alternative embodiments of the invention. FIG. 7 is an enlarged plan view of a touch region 'TA' of FIG. 6. FIG. 8 is a cross-sectional view of the touch sensor of FIG. 6, taken along line II-II' of FIG. 7.

Referring to FIGS. 6, 7 and 8, in an embodiment, a touch sensor 320 may be disposed on a first substrate 310. The display device may further include a lower adhesive layer 312 and a base film 314, which are disposed on a rear surface of the first substrate 310.

The touch sensor 320 may include a plurality of piezoelectric devices 322. The plurality of the piezoelectric devices 322 may be arranged in the first and second directions DR1 and DR2 or in a matrix form. First signal lines 323 and second signal lines 324 may from a pad portion 329 and may be electrically connected to the plurality of piezoelectric devices 322. Each of the piezoelectric devices 322 may be connected to a corresponding one of the first signal lines 323 and a corresponding one of the second signal lines 324. In one embodiment, for example, when a touch driving signal is output from the pad portion 329, it may be sequentially provided to the first signal lines 323, which extend in the first direction DR1 and are sequentially arranged in the second direction DR2. Here, in the case where external pressure is exerted to the piezoelectric device 322, the piezoelectric device 322 may transmit the touch driving signal, which is transmitted through the first signal line 323, to the second signal line 324. The second signal lines 324 may transmit a touch sensing signal from the piezoelectric devices 322 to the pad portion 329.

In an embodiment, as shown in FIG. 6, the piezoelectric devices 322 may have a rectangular shape, but the invention is not limited thereto. In one embodiment, for example, a shape of each of the piezoelectric devices 322 may be one of polygons (e.g., rhombus, triangle, and hexagon), circle, and ellipse.

The first signal line 323 may include a portion extending in the first direction DR1 and a portion extending in the second direction DR2. The portion of the first signal line 323 extending in the second direction DR2 may be connected to the pad portion 329. The second signal line 324 may extend in the second direction DR2 and may be connected to the pad portion 329. The first signal line 323 and the second signal line 324 may be disposed at a level different from that of the piezoelectric device 322 and may be formed of a material different from that of the piezoelectric device 322. The first signal line 323 and the second signal line 324 may be disposed on an adhesive layer 321 and the piezoelectric device 322. The first signal line 323 and second signal line 324 may include or be formed of at least one selected from transparent conductive materials (e.g., ITO) and low resistance metallic materials (e.g., molybdenum (Mo), silver (Ag), titanium (Ti), copper (Cu) and aluminum (Al)). The first signal line 323 and the second signal line 324 may be disposed at a same level or directly on a same layer as each other. The second signal line 324 may include signal lines 324a and 324b, which are electrically connected to each other through a bridge electrode 326. The signal lines 324a and 324b may be spaced apart from each other in the second direction DR2 by a predetermined distance. The first signal line 323 and the signal lines 324a and 324b may be electrically disconnected from each other by an insulating layer 328. The insulating layer 328 may be formed of or include an inorganic insulating material (e.g., silicon nitride (SiNx) or silicon oxide (SiOx)).

The first signal line 323 may include a branch portion 327, which is positioned on the piezoelectric device 322 and is branched from a main portion of the first signal line 323. The second signal line 324 may include a branch portion 325, which is positioned on the piezoelectric device 322 and is branched from the signal line 324b. Each of the branch portions 327 and 325 of the first and second signal lines 323 and 324 may have a comb-like structure including a plurality of patterns. In some embodiments, as shown in FIG. 7, the branch portions 327 and 325 may be disposed in a way such that the patterns of the branch portions 327 and 325 are alternatingly arranged with each other. Such an arrangement of the branch portions 327 and 325 of the first and second signal lines 323 and 324 may improve piezoelectric sensitivity of the touch sensor 320.

Figure 9:
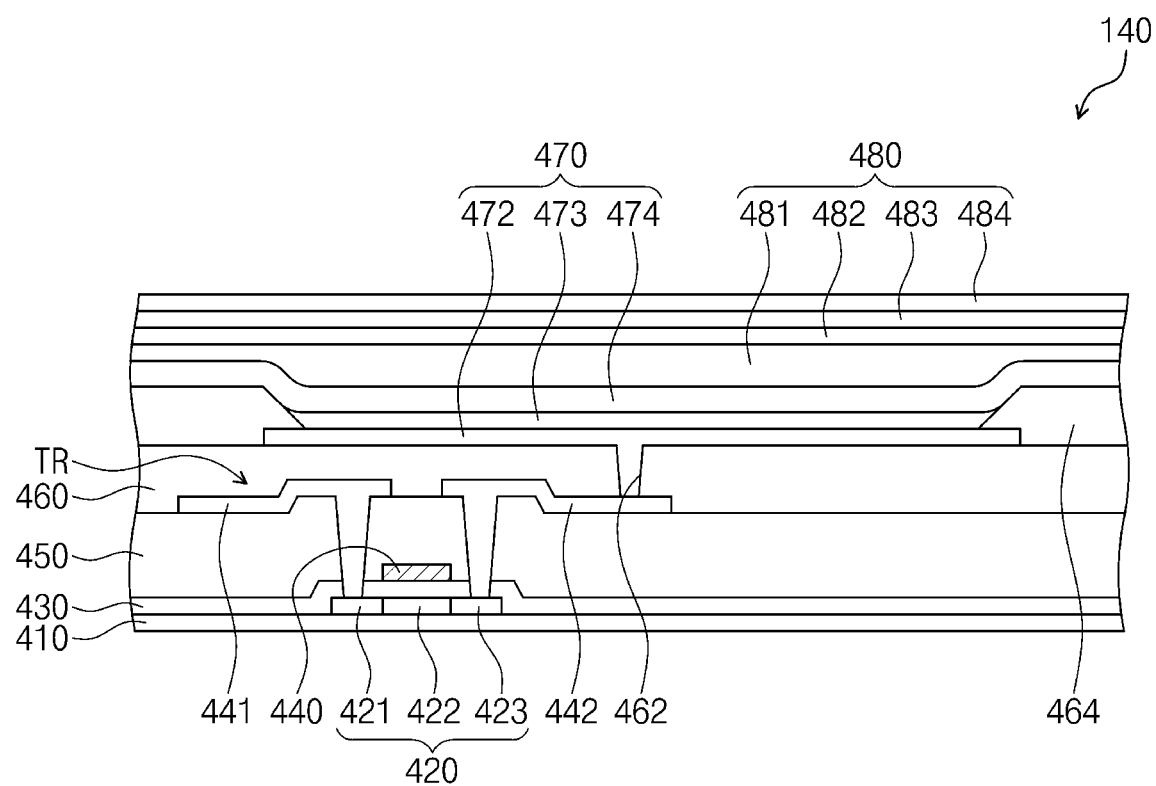
FIG. 9 is a cross-sectional view of the display unit of FIG. 1.

FIG. 9 is a cross-sectional view of the display unit of FIG. 1.

Referring to FIG. 9, the display unit 140 may include a buffer layer 410 disposed on the second substrate 130 of FIG. 1. The buffer layer 410 may have a single-layered structure, which includes or is made of silicon nitride (SiNx), or a double-layered structure, in which a silicon nitride (SiNx) layer and a silicon oxide (SiO2) layer are stacked one on the other. The buffer layer 410 may prevent undesired substance (e.g., contaminants, impurities, or moisture) from infiltrating into the display unit 140 and provide a flat surface.

A semiconductor layer 420 may be disposed on the buffer layer 410. The semiconductor layer 420 may be formed of poly silicon and may include a channel region 422, a source region 421, and a drain region 423. The source region 421 and the drain region 423 may be respectively positioned at both sides of the channel region 422. A gate insulating layer 430 may be disposed on the semiconductor layer 420. The gate insulating layer 430 may include at least one of silicon nitride or silicon oxide and may have a single- or multi-layered structure.

A gate electrode 440 of a transistor TR may be disposed on the gate insulating layer 430. The gate electrode 440 may be overlapped with the channel region 422 of the semiconductor layer 420 and may be disposed on the gate insulating layer 430. In certain embodiments, the gate electrode 440 may be a double layered structure including a gate lower electrode and a gate upper electrode.

An interlayered insulating layer 450 may be disposed on the gate electrode 440. The interlayered insulating layer 450 may have contact holes, each of which is formed to expose the source or drain region 421 or 423 of the semiconductor layer 420.

A source electrode 441 and a drain electrode 442 may be disposed on the interlayered insulating layer 450. The source electrode 441 may be connected to the source region 421 of the semiconductor layer 420, and the drain electrode 442 may be connected to the drain region 423 of the semiconductor layer 420.

A protection layer 460, which include or is formed of an inorganic or organic material, may be disposed on the transistor TR. In an embodiment where the protection layer 460 is formed of an organic material, the protection layer 460 may have a flat surface. A contact hole 462 is defined through the protection layer 460 to expose a portion of the transistor TR under the protection layer 460. A pixel electrode 472 may be disposed on the protection layer 460. The pixel electrode 472 may be in contact with the drain electrode 442 of the transistor TR via the contact hole 462. The pixel electrode 472 may include a reflective electrode and a transparent electrode thereon. The reflective electrode may include or be formed of highly reflective metals, e.g., silver (Ag) or aluminum (Al), or alloys thereof, and the transparent electrode may include or be formed of transparent conductive oxides, e.g., ITO or indium zinc oxide ("IZO").

A pixel defining layer 464 may be disposed on the protection layer 460 to cover an edge region of the pixel electrode 472. The pixel defining layer 464 exposes the pixel electrode 472 expect for the edge region thereof.

An organic light emitting layer 473 may be disposed on the pixel electrode 472, and a common electrode 474 may be disposed on the organic light emitting layer 473 and the pixel defining layer 464.

The organic light emitting layer 473 may include a light emitting layer (not shown), which emits light, and organic layers (not shown), which efficiently transfers carriers (e.g., holes or electrons) to the light emitting layer. The organic layers may include a hole injection layer and a hole transport layer, which are interposed between the pixel electrode 472 and the light emitting layer, and may include an electron injection layer and an electron transport layer, which are interposed between the common electrode 474 and the light emitting layer.

A thin-film encapsulation layer 480 may be disposed on the common electrode 474. The thin-film encapsulation layer 480 may hermetically seal an organic light emitting device 470, which is disposed on the buffer layer 410 from outside environment.

The thin-film encapsulation layer 480 may include organic encapsulation layers 481 and 483 and inorganic encapsulation layers 482 and 484, which are alternatingly and sequentially stacked one on another. FIG. 9 illustrates an embodiment of the thin-film encapsulation layer 480 in which two organic encapsulation layers 481 and 483 and two inorganic encapsulation layers 482 and 484 are alternately stacked, but the invention is not limited thereto. In one alternative embodiment, for example, the thin-film encapsulation layer 480 may include an inorganic encapsulation layer, an organic encapsulation layer, and an inorganic encapsulation layer, which are sequentially stacked. In such an embodiment at least one of the organic encapsulation layers may be thicker than the inorganic encapsulation layer.

Figure 10:
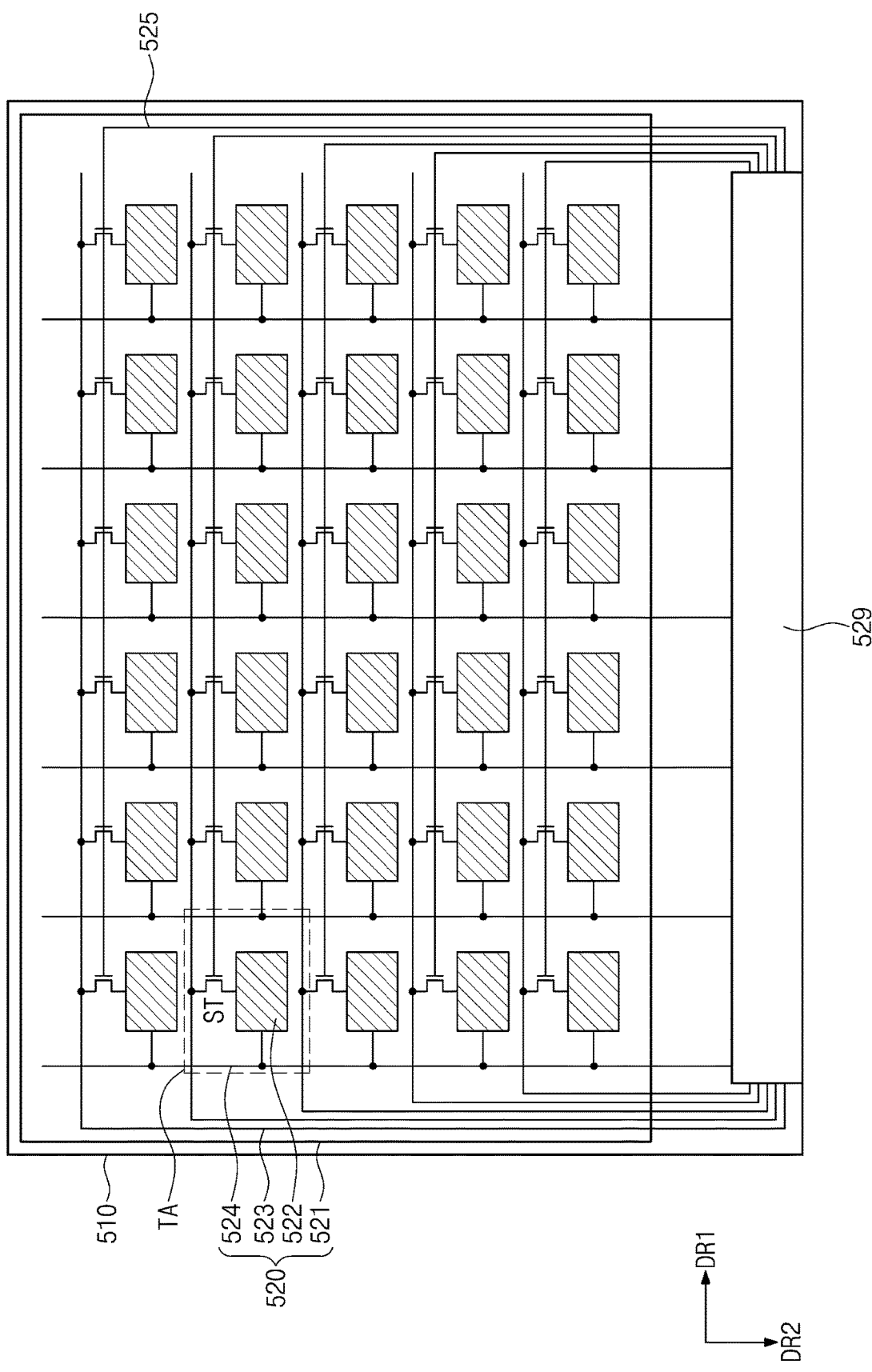
FIG. 10 is a plan view of a touch sensing unit according to some embodiments of the invention.

FIG. 10 is a plan view of a touch sensing unit according to some embodiments of the invention.

Referring to FIG. 10, a touch sensing unit 520 may be disposed on a first substrate 510. The touch sensing unit 520 may include an adhesive layer 521, a plurality of piezoelectric devices 522 and a plurality of switching transistors ST, which correspond to the piezoelectric devices 522, respectively. The plurality of the piezoelectric devices 522 may be arranged in the first and second directions DR1 and DR2 or in a matrix form. First signal lines 523, second signal lines 524 and third signal lines 525 may extend from a pad portion 529 and may be electrically connected to the plurality of the piezoelectric devices 522. Each of the piezoelectric devices 522 may be connected to a corresponding one of the first signal lines 523, a corresponding one of the second signal lines 524, and a corresponding one of the third signal lines 525.

Each of the switching transistors ST may include a first electrode connected to a corresponding one of the first signal lines 523, a second electrode connected to a corresponding one of the piezoelectric devices 522, and a gate electrode connected to a corresponding one of the third signal lines 525.

When a touch driving signal is output from the pad portion 529, it may be sequentially provided to the first signal lines 523, which extend in the first direction DR1 and are sequentially arranged in the second direction DR2. In certain embodiments, the touch driving signal output from the pad portion 529 may be provided to the first signal lines 523 at the same time.

When a touch switching signal is output from the pad portion 529, the touch switching signal may be sequentially provided to the third signal lines 525, which extend in the first direction DR1 and are sequentially arranged in the second direction DR2.

When the touch driving signal is provided from the pad portion 529 through the first signal lines 523 and the touch switching signal is provided from the pad portion 529 through the third signal lines 525, the touch driving signal may be provided to the piezoelectric device 522 through the switching transistor ST.

When an external pressure is exerted to the piezoelectric device 522, the piezoelectric device 522 may transmit the touch driving signal, which is transmitted through the first signal line 523, to the second signal line 524. The second signal lines 524 may transmit a touch sensing signal, which is transmitted from the piezoelectric devices 522, to the pad portion 529.

The touch switching signal transmitted from the pad portion 529 may be sequentially provided to the third signal lines 525, which are sequentially arranged in the second direction DR2. Since the touch driving signal transmitted from the first signal lines 523 is provided to the piezoelectric device 522 through the switching transistor ST turned on by the touch switching signal, it may be possible to control a timing of providing the touch driving signal to the piezoelectric device 522. Accordingly, it may be possible to improve piezoelectric sensitivity of a display device.

Figure 11A:
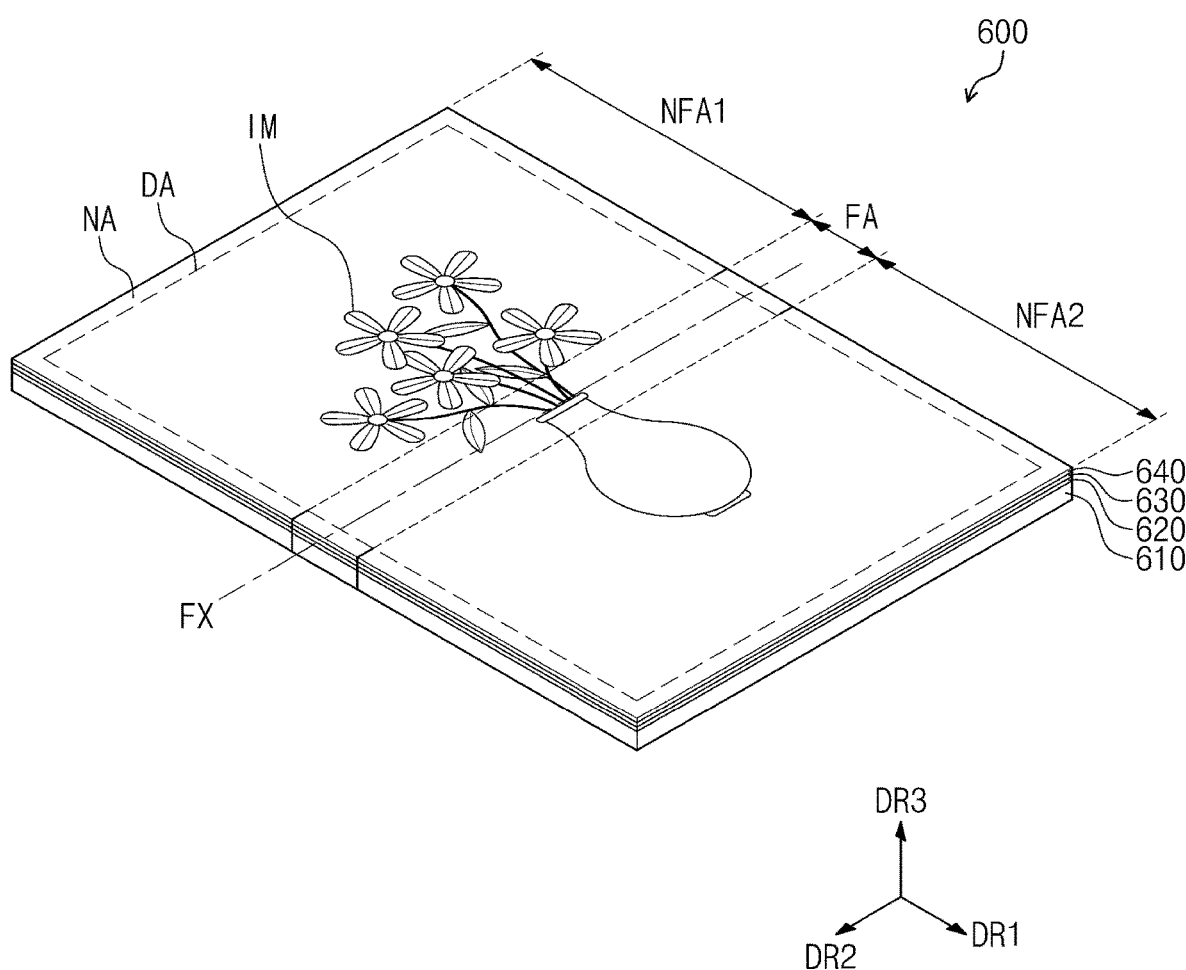
FIG. 11A is a perspective view illustrating a foldable display module according to some embodiments of the invention.
Figure 11B:
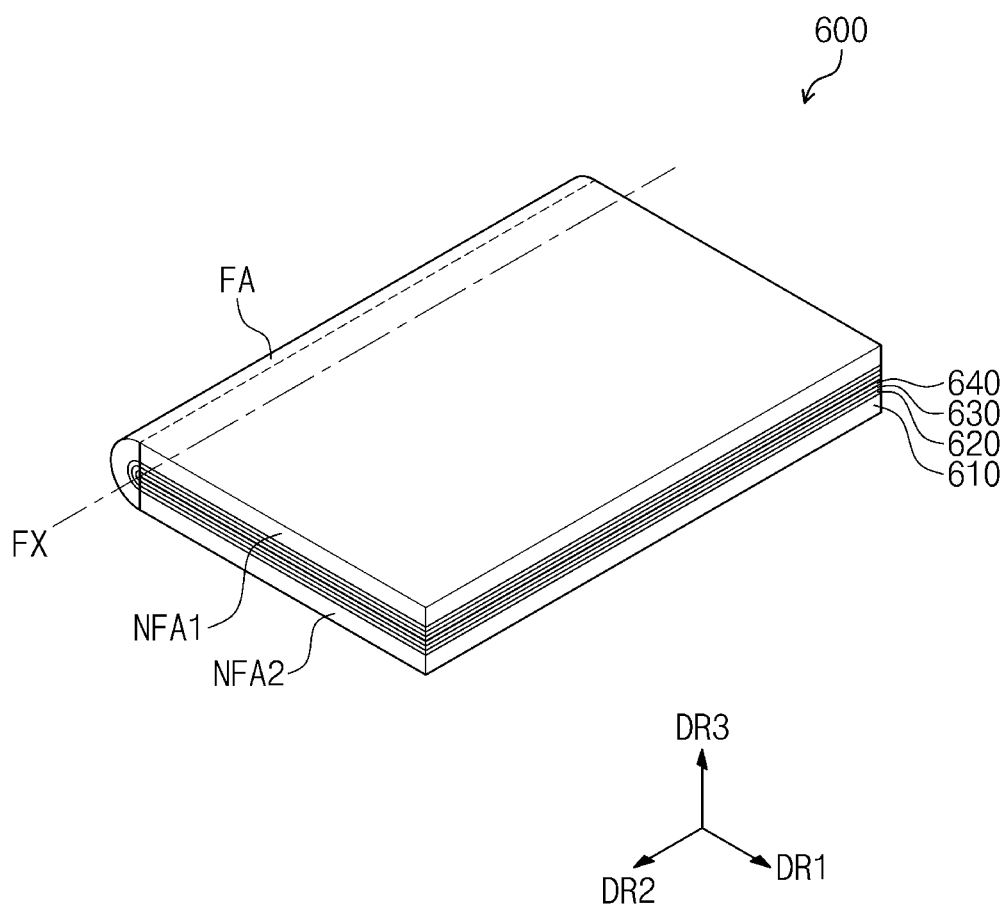
FIG. 11B is a perspective view of a foldable display module in a folded state, according to some embodiments of the invention.

FIG. 11A is a perspective view illustrating a foldable display module according to some embodiments of the invention. FIG. 11B is a perspective view of a foldable display module in a folded state, according to some embodiments of the invention.

As shown in FIGS. 11A and 11B, an embodiment of a foldable display module 600 may include a first non-folding region NFA1, a second non-folding region NFA2, and a folding region FA. FIGS. 11A and 11B merely illustrate an exemplary embodiment of a foldable display module. In an alternative embodiment, the foldable display module 600 may include two or more folding regions.

The folding region FA may be located between the first and second non-folding regions NFA1 and NFA2. A folding axis FX may be defined in the folding region FA. The foldable display module 600 may be foldable or be configured to be folded around the folding axis FX. In such an embodiment, the folding axis FX may be a rotating axis, and a part of the foldable display module 600 may define the folding axis FX.

The foldable display module 600 may include the display region DA, which displays the image IM, and the non-display region NA, which surrounds the display region DA. The display region DA may be divided into a display surface of the first non-folding region NFA1, a display surface of the second non-folding region NFA2, and a display surface of the folding region FA. Hereinafter, the first direction DR1 and the second direction DR2 may be defined to be parallel to a display surface of the foldable display module 600 in an unfolded state. A third direction DR3 may indicate a thickness direction of the foldable display module 600. In addition, the second direction DR2 may be defined to be parallel to an extension direction of the folding axis FX.

As shown in FIG. 11B, the foldable display module 600 may be folded around the folding axis FX in such a way that the display surface of the first non-folding region NFA1 faces the display surface of the second non-folding region NFA2. Hereinafter, the term 'inner folding' refers to a folding operation, in which a display module is folded to allow the display surfaces thereof to face each other. In an embodiment, the inner folding of the foldable display module 600 may be performed in such a way that the first non-folding region NFA1 is rotated about the folding axis FX in a clockwise direction. To align the first non-folding region NFA1 to the second non-folding region NFA2 during the inner folding of the foldable display module 600, the folding axis FX may be defined to be located on a center of the foldable display module 600 in the first direction DR1.

In some embodiments, although not shown, the foldable display module 600 may be folded around the folding axis FX in such a way that the display surfaces of the first and second non-folding regions NFA1 and NFA2 are exposed externally or to an outside. Hereinafter, the term 'outer folding' refers to a folding operation, in which a display module is folded to allow the display surfaces thereof to be exposed to the outside.

As shown in FIGS. 11A and 11B, when the display surfaces of the first and second non-folding regions NFA1 and NFA2 are exposed to the outside, the image IM may be displayed on the display surfaces of the first and second non-folding regions NFA1 and NFA2. In such an embodiment, the image IM may also be displayed on the display surface of the folding region FA exposed to the outside. The first non-folding region NFA1, the second non-folding region NFA2, and the folding region FA may display images, which are independent of each other, or to display images, which are associated with each other.

The foldable display module 600 may include a first substrate 610, a touch sensor 620, a second substrate 630 and a display unit 640, as previously described with reference to FIG. 1. Although not shown in FIG. 1, a polarization plate may be further disposed on the display unit 640.

Figure 12A:
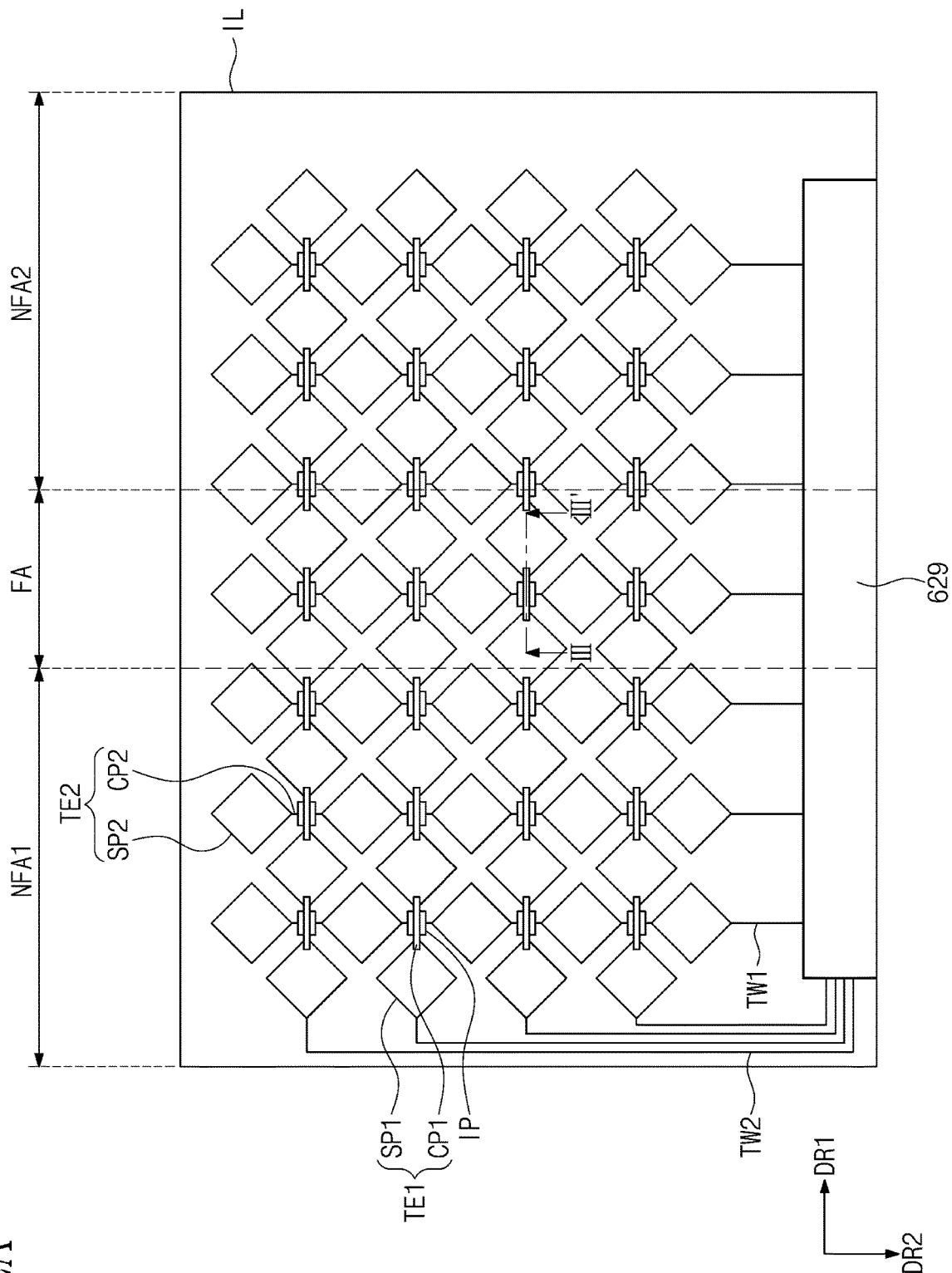
FIG. 12A is a schematic diagram illustrating an example of a first touch sensor, which is a part of the touch sensor of FIG. 11A and is operated in an electrostatic capacitance manner.
Figure 12B:
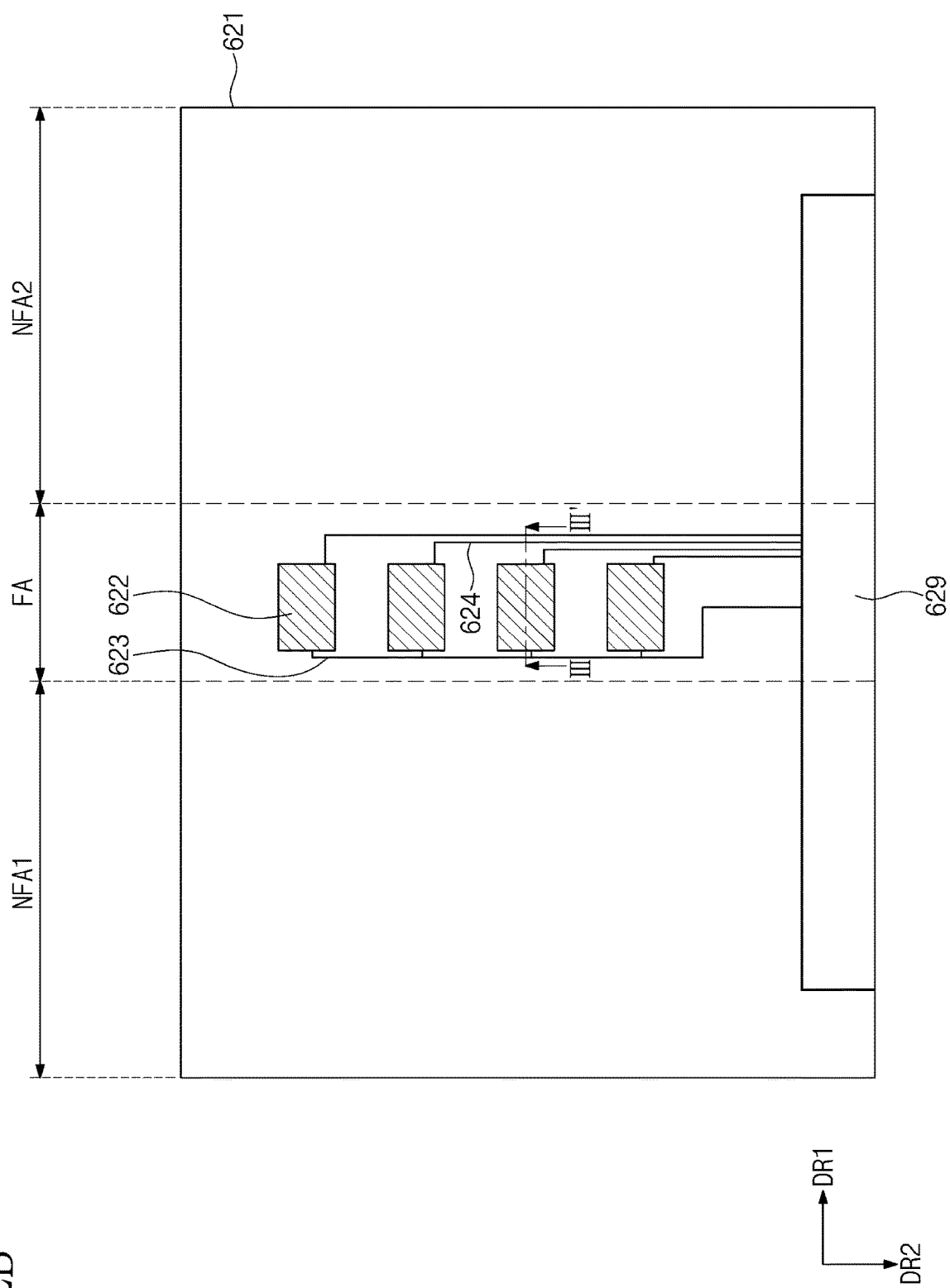
FIG. 12B is a schematic diagram illustrating an example of a second touch sensor, which is a part of the touch sensor of FIG. 11A and is operated in a pressure manner.
Figure 13:
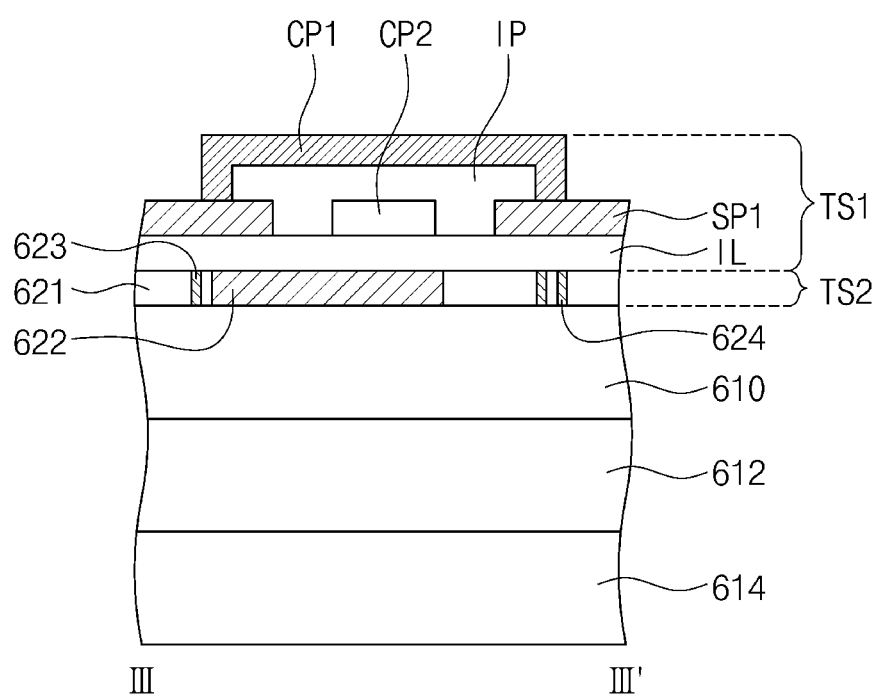
FIG. 13 is a cross-sectional view taken along lines of FIGS. 12A and 12B.

FIG. 12A is a schematic diagram illustrating an exemplary embodiment of a first touch sensor, which is a part of the touch sensor of FIG. 11A and is operated in an electrostatic capacitance manner. FIG. 12B is a schematic diagram illustrating an exemplary embodiment of a second touch sensor, which is a part of the touch sensor of FIG. 11A and is operated in a pressure manner. FIG. 13 is a cross-sectional view taken along line III-III' of FIGS. 12A and 12B.

Referring to FIG. 12A, a first touch sensor may include the first non-folding region NFA1, the folding region FA, and the second non-folding region NFA2.

The first touch sensor may include a plurality of conductive patterns on an insulating layer IL. For example, the conductive patterns may be disposed on the insulating layer IL. The conductive patterns may include a first touch electrode TE1, a second touch electrode TE2, a first signal line TW1, and a second signal line TW2.

The first touch electrode TE1 may extend in the first direction DR1. The first touch electrode TE1 may include a plurality of sensing patterns SP1, which are arranged in the first direction DR1, and a plurality of connection patterns CP1, which are arranged in the first direction DR1 and each of which is positioned between an adjacent pair of the sensing patterns SP1.

The second touch electrode TE2 may extend in the second direction DR2. The second touch electrode TE2 may have substantially the same shape as the first touch electrode TE1, but extension directions thereof are different from each other. In one embodiment, for example, the second touch electrode TE2 may include a plurality of sensing patterns SP2, which are arranged in the second direction DR2, and a plurality of connection patterns CP2, which are arranged in the second direction DR2 and each of which is positioned between an adjacent pair of the sensing patterns SP2.

The sensing patterns SP1 of the first touch electrode TE1 and the sensing patterns SP2 of the second touch electrode TE2 may be disposed at a same level or directly on a same layer. In an embodiment, the sensing patterns SP1 of the first touch electrode TE1, the sensing patterns SP2 of the second touch electrode TE2, and the connection patterns CP1 of the first touch electrode TE1 may be disposed at a same level or directly on a same layer.

The first touch sensor may further include a plurality of insulating patterns IP, which are disposed between the connection patterns CP1 of the first touch electrode TE1 and the connection patterns CP2 of the second touch electrode TE2. The connection patterns CP2 of the second touch electrode TE2 and the connection patterns CP1 of the first touch electrode TE1 may be electrically disconnected from each other by the insulating patterns IP and may cross each other.

A pad portion 629 may define a pathway for electrically connecting the touch sensor 620 to an external device. In one embodiment, for example, the touch sensor 620 may receive or provide an electrical signal from or to an external device through the pad portion 629.

The first signal line TW1 may connect the first touch electrode TE1 to the pad portion 629, and the second signal line TW2 may connect the second touch electrode TE2 to the pad portion 629.

Referring to FIG. 12B, a second touch sensor may include the first non-folding region NFA1, the folding region FA, and the second non-folding region NFA2. The second touch sensor may include an adhesive layer 621, a piezoelectric device 622, a third signal line 623, and a fourth signal line 624.

The adhesive layer 621 may include a-Si.

The piezoelectric device 622, the third signal line 623, and the fourth signal line 624 may be disposed at a same level as the adhesive layer 621. In one embodiment, for example, the piezoelectric device 622, the third signal line 623, and the fourth signal line 624 may include or be formed a polysilicon layer, which is obtained by crystallizing the amorphous silicon layer of the adhesive layer 621.

The third signal line 623 may connect the piezoelectric device 622 to the pad portion 629, and the fourth signal line 624 may connect the piezoelectric device 622 to the pad portion 629.

In certain embodiments, the third signal line 623 and the fourth signal line 624 may be disposed at a level different from that of the adhesive layer 621 and may include or be formed of a material different from that of the adhesive layer 621.

Referring to FIG. 13, a lower adhesive layer 612 and a base film 614 may be disposed on a rear surface of the first substrate 610. A second touch sensor TS2 may be disposed on the first substrate 610. In such an embodiment, the second touch sensor TS2 and the first substrate 610 may have the same features as those of FIG. 12B and FIG. 1, respectively. A first touch sensor TS1 may be disposed on the second touch sensor TS2, and here, the first touch sensor TS1 may have the same features as that of FIG. 12A. The insulating layer IL of first touch sensor TS1 may be disposed on the second touch sensor TS2.

Figure 14:
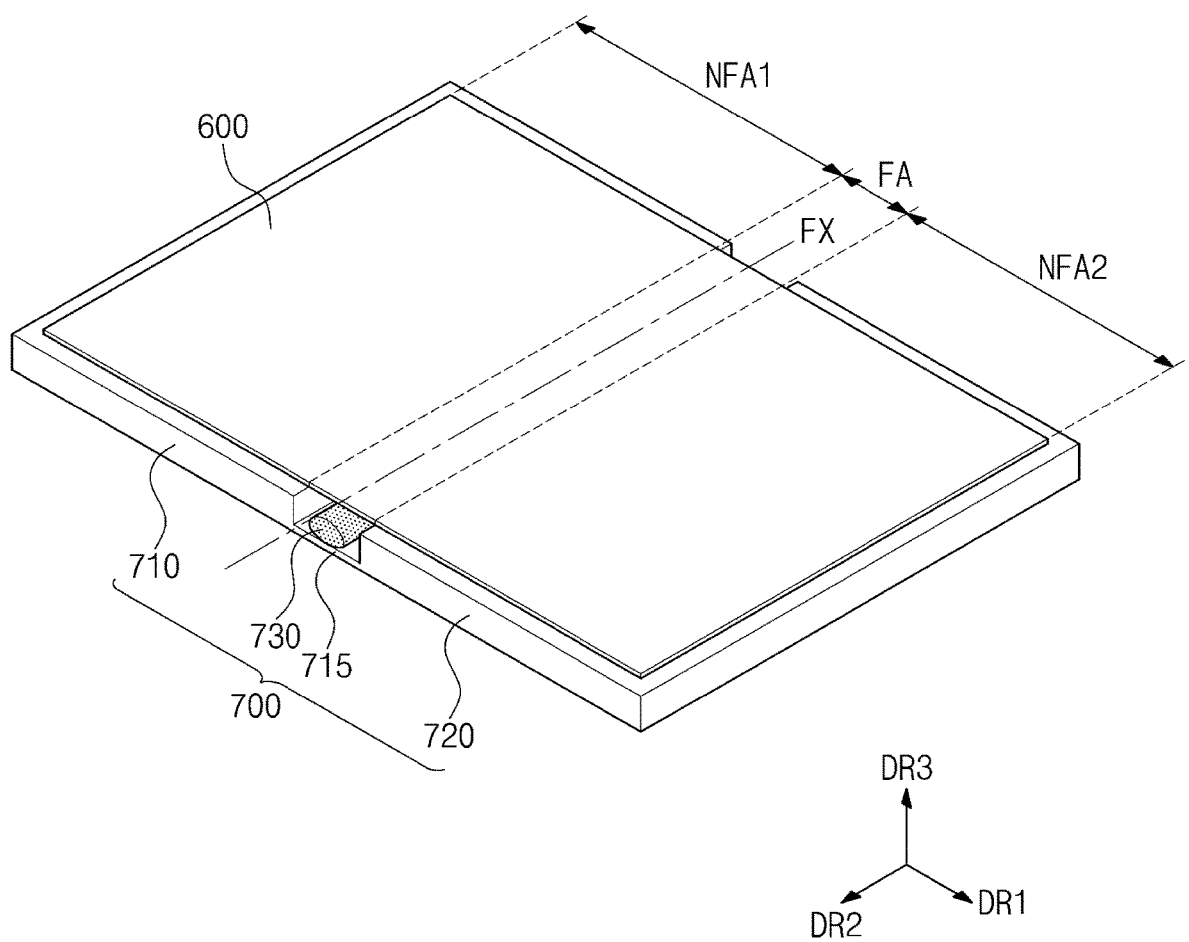
FIG. 14 is a perspective view illustrating a foldable display device according to some embodiments of the invention.
Figure 15:
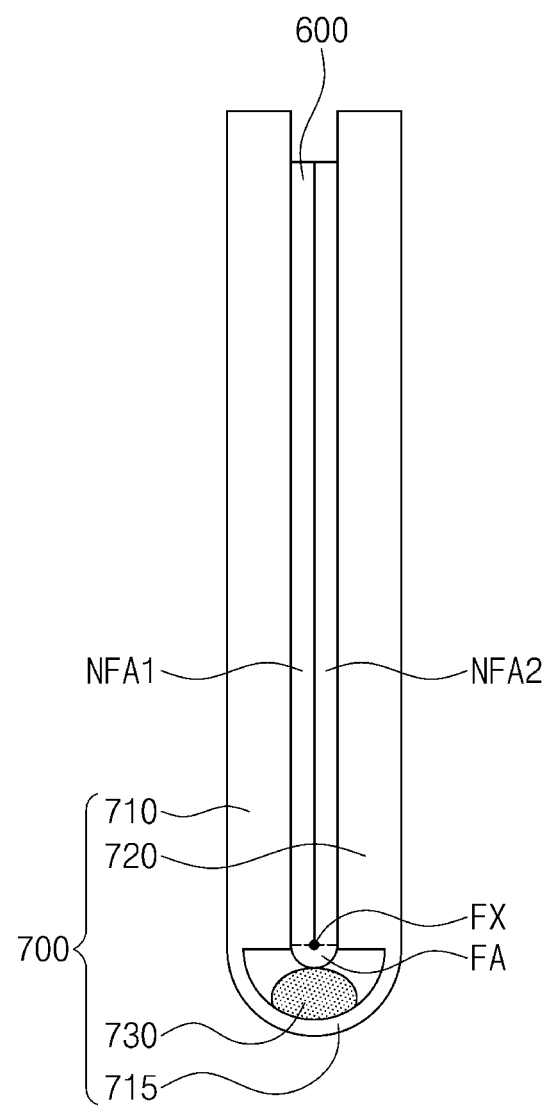
FIG. 15 is a cross-sectional view of a foldable display device in a folded state, according to some embodiments of the invention.

FIG. 14 is a perspective view illustrating a foldable display device according to some embodiments of the invention. FIG. 15 is a cross-sectional view of a foldable display device in a folded state, according to some embodiments of the invention.

Referring to FIGS. 14 and 15, a foldable display device may further include a housing 700, in addition to the foldable display module 600. The foldable display module 600 may be partially or wholly coupled to the housing 700. However, the invention is not limited to a specific coupling structure between the foldable display module 600 and the housing 700. The housing 700 may provide a flat surface, on which the foldable display module 600 is disposed. In some embodiments, the housing 700 may provide a space, and the foldable display module 600 may be disposed in the space. In some embodiments, the housing 700 may define a stepwise space, and the foldable display module 600 may be disposed in the stepwise space.

The foldable display module 600 may be entirely rollable or to be foldable around a specific region.

The housing 700 may include a plurality of portions coupled to each other. In one embodiment, for example, the housing 700 may include a first supporting member 710, a second supporting member 720, a connection member 715, and a contact member 730. The first and second supporting members 710 and 720 may support the first and second non-folding regions NFA1 and NFA2, respectively, and may be coupled to the first and second non-folding regions NFA1 and NFA2, respectively. The connection member 715 and the contact member 730 may be disposed below the folding region FA of the foldable display module 600.

The first and second supporting members 710 and 720 may be connected to each other through the connection member 715, and the connection member 715 may have a shape enclosing the contact member 730. In some embodiments, the first supporting member 710, the connection member 715 and the second supporting member 720 may be connected to each other, and in such embodiments, the first supporting member 710, the connection member 715 and the second supporting member 720 may be in the form of a single unitary body. The contact member 730 may have a circular pillar shape extending in the second direction DR2. A length of the contact member 730 in the second direction DR2 may be equal to or shorter than that of the connection member 715 in the second direction DR2. The contact member 730 may include or be formed of a rigid or soft material. In an embodiment where the contact member 730 is formed of the soft material, a shape thereof may be changed when the housing 700 is folded.

When the foldable display module 600 is in an unfolded state, the contact member 730 may be spaced apart from the folding region FA of the foldable display module 600 by a predetermined distance.

As shown in FIG. 15, when the foldable display module 600 is folded in such a way that the display surface of the first non-folding region NFA1 faces the display surface of the second non-folding region NFA2, the contact member 730 may be in contact with the folding region FA of the foldable display module 600, and thus, pressure may be exerted on the folding region FA of the foldable display module 600.

As described above with reference to FIGS. 12A and 12B, the folding region FA of the foldable display module 600 may include the piezoelectric devices 622. In such an embodiment, when the foldable display module 600 is folded to allow the contact member 730 to be in contact with the folding region FA, pressure may be applied to the piezoelectric devices 622 of the folding region FA from the contact member 730. In such an embodiment, when the display surfaces of the first and second non-folding regions NFA1 and NFA2 of the foldable display module 600 are spaced apart from each other by a predetermined distance or greater, the contact member 730 may be separated from the folding region FA. Accordingly, the piezoelectric devices 622, which are arranged on the folding region FA of the foldable display module 600, may detect whether the foldable display module 600 is in a folded state or not.

In an embodiment of the foldable display module 600, the image IM to be displayed on the display region DA may be controlled based on detection signals from the piezoelectric devices 622. In one embodiment, for example, when the foldable display module 600 is in a folded state, the display region DA may be controlled not to display an image, and when the foldable display module 600 is in an unfolded state, the display region DA may be controlled to display the image IM.

According to some embodiments of the invention, a display device may include a piezoelectric device including polysilicon. Here, the polysilicon of the piezoelectric device may be formed by crystalizing a region of an adhesive layer including amorphous silicon. The piezoelectric device and the adhesive layer constituting a touch sensor may be provided at the same level, and thus, it may be possible to reduce or minimize a thickness of the touch sensor. In addition, since the touch sensor is disposed on a rear surface of the display unit, the touch sensor may not result in a reduction in visibility of the display device.

While exemplary embodiments of the invention have been particularly shown and described, it will be understood by one of ordinary skill in the art that variations in form and detail may be made therein without departing from the spirit and scope of the attached claims.

What is claimed is:

1. A display device, comprising:
   a first substrate;
   a touch sensor disposed on the first substrate;
   a second substrate disposed on the touch sensor; and
   a display unit disposed on the second substrate and which displays an image;
   wherein the touch sensor comprises a piezoelectric device, which senses a touch thereon, and an adhesive layer, which attaches the first and second substrates to each other,
   an entirety of the piezoelectric device and an entirety of the adhesive layer are disposed on the first substrate and have a same thickness as each other defining a same layer,
   wherein the touch sensor further comprises a first signal line and a second signal line, which are connected to the piezoelectric device, and
   wherein the first and second signal lines are disposed in the same-layer as the piezoelectric device.

2. The display device of claim 1, wherein the piezoelectric device of the touch sensor comprises a polysilicon.

3. The display device of claim 1, wherein the first and second signal lines comprise a polysilicon.

4. The display device of claim 1, wherein the first signal line and the second signal line comprise a first metal layer and a second metal layer, respectively.

5. The display device of claim 1, wherein the touch sensor comprises a plurality of piezoelectric devices, which are arranged in a matrix form including a plurality of rows and a plurality of columns.

6. The display device of claim 5, wherein
   the second signal line comprises a plurality of second signal lines,
   the plurality of piezoelectric devices are connected to the first signal line, and
   each of the plurality of piezoelectric devices is connected to a corresponding one of the plurality of second signal lines.

7. The display device of claim 5, wherein each of the plurality of piezoelectric devices is connected to a corresponding one of a plurality of first signal lines and a corresponding one of a plurality of second signal lines.

8. The display device of claim 7, wherein
   the plurality of first signal lines are arranged in a first direction, and
   the plurality of second signal lines are arranged and are spaced apart from each other in a second direction crossing the first direction in a way such that the second signal lines do not overlap the first signal lines.

9. The display device of claim 8, wherein the touch sensor further comprises:
   a bridge electrode, which electrically connects the second signal lines spaced apart from each other in the second direction to each other; and
   an insulating layer disposed between the first signal lines and the bridge electrode.

10. The display device of claim 8, wherein the touch sensor comprises:
    a first extension line extending from the first signal line and disposed on the piezoelectric device; and
    a second extension line extending from the second signal line and disposed on the piezoelectric device,
    wherein the first and second extension lines are spaced apart from each other by a predetermined distance.

11. The display device of claim 1, wherein the first substrate be defined by a lower protection film.

12. The display device of claim 11, further comprising,
    a base substrate; and
    a lower adhesive layer disposed between the first substrate and the base substrate.

13. The display device of claim 1, wherein the display unit comprises an organic electric field light-emitting device and an encapsulation layer, which seals the organic electric field light-emitting device.

14. A display device, comprising:
    a housing including a contact member; and a display module coupled to the housing and spaced apart from the contact member by a predetermined distance,
wherein the display module comprises a folding region, a first non-folding region adjacent to the folding region, and a second non-folding region, wherein the folding region is interposed between the first non-folding region and the second non-folding region,
wherein the display module further comprises:
a first substrate;
a touch sensor disposed on the first substrate and in the folding region; and
a second substrate disposed on the touch sensor, wherein the touch sensor comprises:
a piezoelectric device, which senses an external pressure; and
an adhesive layer, which attaches the first and second substrates to each other,
wherein an entirety of the piezoelectric device and an entirety of the adhesive layer are disposed on the first substrate and have a same thickness as each other defining a same layer,
wherein the touch sensor further comprises a first signal line and a second signal line, which are connected to the piezoelectric device, and
wherein the first and second signal lines are disposed in the same layer as the piezoelectric device.

15. The display device of claim 14, wherein
the housing further comprises a first supporting member, a second supporting member, and a connection member, which connects the first supporting member to the second supporting member and encloses the contact member,
the first non-folding region is coupled to the first supporting member,
the second non-folding region is coupled to the second supporting member, and
the folding region is provided to correspond to the connection member.

16. The display device of claim 14, wherein the piezoelectric device of the touch sensor comprises a polysilicon.

17. The display device of claim 16, wherein
the first and second signal lines comprise a polysilicon.

18. The display device of claim 14, wherein the folding region of the display module is foldable around a folding axis extending in a first direction.

19. The display device of claim 14, wherein the display module further comprises a display unit, which overlaps the first non-folding region, the folding region and the second non-folding region and displays an image.

* * * * *